(12) United States Patent
Uramoto et al.

(10) Patent No.: US 7,034,731 B2
(45) Date of Patent: Apr. 25, 2006

(54) A/D CONVERTER APPARATUS AND D/A CONVERTER APPARATUS INCLUDING A DIGITAL FILTER

(75) Inventors: Yasutaka Uramoto, Yokohama (JP); Kouji Kanamori, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/008,116

(22) Filed: Dec. 10, 2004

(65) Prior Publication Data

US 2005/0128110 A1    Jun. 16, 2005

(30) Foreign Application Priority Data

Dec. 12, 2003    (JP) .......................... P2003-411412

(51) Int. Cl.
*H03M 3/00*    (2006.01)
(52) U.S. Cl. ...................... 341/143; 341/144; 341/155
(58) Field of Classification Search ............... 341/144, 341/155, 143
See application file for complete search history.

(56) References Cited

U.S. PATENT DOCUMENTS

| | | | | |
|---|---|---|---|---|
| 5,223,926 A | * | 6/1993 | Stone et al. | 375/240.01 |
| 5,396,489 A | * | 3/1995 | Harrison | 370/210 |
| 6,081,216 A | | 6/2000 | May | 341/143 |
| 6,252,531 B1 | | 6/2001 | Gordon et al. | 341/143 |
| 2004/0247133 A1 | * | 12/2004 | Gierl et al. | 381/7 |

FOREIGN PATENT DOCUMENTS

JP        8/279755        10/1996

* cited by examiner

*Primary Examiner*—Peguy JeanPierre
(74) *Attorney, Agent, or Firm*—McDermott Will & Emery LLP

(57) ABSTRACT

An A/D converter apparatus for converting an analog signal output from an anti-aliasing filter into a digital signal, a sinc filter for removing a frequency component corresponding to an aliasing noise generated by down-sampling, a first decimator for down-sampling a signal output from the sinc filter, a low pass filter for removing a frequency component corresponding to an aliasing noise generated by down-sampling, a second decimator for down-sampling a signal output from the low pass filter, and a high pass filter for removing a dc component from a signal output from the second decimator are disclosed.

4 Claims, 5 Drawing Sheets

A/D CONVERTER APPARATUS 100

A/D AND D/A CONVERTER APPARATUS 300

A/D CONVERTER APPARATUS 500

US 7,034,731 B2

A/D CONVERTER APPARATUS AND D/A CONVERTER APPARATUS INCLUDING A DIGITAL FILTER

This application is based on Japanese Patent Application No. 2003-411412, which is incorporated herein by reference.

BACKGROUND OF THE INVENTION

1. Field of the Invention

The present invention relates to an A/D converter apparatus and a D/A converter apparatus comprising a digital filter.

2. Description of the Related Art

An A/D and D/A conversion technique is necessary for connecting information society which demands high-speed and high reliability in digitizing information with the natural world in which all the information is expressed by analog signal, and is widely used in various fields such as audio processing, video processing, and analog signal control.

The A/D conversion means a process for sampling analog signals in a discrete time and quantizing amplitude information to convert it into digital signals. However, since the digital signal obtained by performing A/D conversion often includes quantization noise generated from the quantization process and aliasing noise generated from sampling process, a process for removing these noises is typically required. As a means for accomplishing this, a digital filter is generally used.

The D/A conversion means a process for holding the digital signal represented in the discrete time to represent it in a consecutive time domain and smoothly transitioning the amplitude information quantized by a smoothing filter. Since the smoothing filter is realized by an analog circuit, it is in the trade-off relationship with the circuit scale, but is the filter having a relatively smooth frequency transition. Accordingly, in a digital circuit, the neighboring aliasing noise which cannot be removed by the smoothing filter must be removed. Thus, as a means for accomplishing this, a digital filter is used.

The digital filter used in any one of the A/D conversion and the D/A conversion is to remove the noise and extract a needed spectrum. According to the form of the digital filter, there are four kinds of the digital filters such as a low pass filter, a high pass filter, a band pass filter and a band rejection filter. The frequency characteristics of these digital filters can be classified into three domains such as a passband, a transition band and a stopband and the form of each domain is determined by the structure and the order of the filter.

As the circuit using the A/D conversion and the D/A conversion, there is an audio CODEC (Coder and Decoder) circuit. The audio CODEC circuit converts an audio analog signal input from a microphone into a digital signal and converts a voice represented with the digital signal into an analog signal, thereby a speaker outputs the voice. In the A/D and D/A conversion technique related to voice, converting a signal component of an audible band without the change thereof and securely removing a signal component out of the audible band are required.

The handling of a frequency component is realized by the digital filter. The more filter is close to an ideal filter (the gradient of the frequency characteristics in the transition band is infinity), the more increased the order of the structure is and the scale of the circuit becomes increased. Accordingly, it is common that the filter is divided into a plurality of stages so that the out-of-band noise component is slowly removed to extract the needed band of frequency component.

FIG. 5 is a schematic diagram of a conventional A/D converter apparatus 500 used in the audio CODEC circuit. The A/D converter apparatus 500 comprises an anti-aliasing filter 1 for previously removing an aliasing noise generated by sampling, an A/D converter 2 for sampling an analog signal at a data rate DR=128Fs (Fs is the sampling frequency of the digital signal which is desired to be obtained), quantizing it and converting it into a digital signal, a SINC filter 3 for removing the aliasing noise due to down-sampling, a decimator 4a for performing the down-sampling at a data rate DR=4Fs, a high pass filter 6 for removing the DC component from the output of the decimator 4a, a low pass filter 5 for removing the aliasing noise generated by down-sampling, and a decimator 4c for performing down-sampling at a data rate DR=Fs.

The sampling rate of the A/D converter 2 should be, for example, at least Fs with respect to the input analog signal of which the spectrum band is limited to ±Fs/2. However, practically, the sampling rate is higher by several times to several tens times, the sampling rate of the digital signal converted by the A/D converter 2 should be reduced by the down-sampling. However, if only down-sampling is simply performed, the aliasing noise and the quantizing noise may be mixed to the needed signal band to remarkably deteriorate the characteristics thereof. Accordingly, the down-sampling must be performed, while removing the signal out-of-band noise.

In FIG. 5, the analog signal (the band thereof is limited to ±Fs/2) input to the A/D converter 2 is sampled at. 128 times (data rate DR=128Fs), and, after the noise in the band of 4Fs is removed by the SINC filter 3 (referred to as a comb filter), the data rate is decreased to 4Fs by the decimator 4a.

Next, after the DC component of the input audio signal is removed by the high pass filter 6, the audio signal passes through the low pass filter 5 to remove the noise at Fs. Then, the down-sampling is performed by the decimator 4c until the data rate becomes Fs to output the digital data at the data rate of Fs.

In FIG. 5, the decimator 4a performs the down-sampling of the output of the SINC filter so that the data rate is decreased from 128Fs to 4Fs, but the ratio thereof is optional. For example, the down-sampling can be performed till Fs, and, in this case, the sharp SINC filter corresponding thereto may affect the signal band such as attenuating a portion of the needed signal. In order to the compensate it, the frequency characteristics of the low pass filter 5 should finely adjusted. In this case, in order to realize the fine frequency characteristics of the low pass filter 5, a plurality of a design parameters are required and, accordingly, the circuit scale may be increased.

On the contrary, the case that the output of the SINC filter 3 is not decreased to 4Fs can be considered. In this case, since the structure of the SINC filter 3 is simply, the circuit scale of the SINC filter 3 itself is reduced. However, the low pass filter 5 which is the next stage must be sharply realized, and the circuit scale of the low pass filter 5 becomes increased.

Accordingly, the structure of the digital filter and the sampling rate of the data input to the filter are mainly determined by the trade-off with the circuit scale.

However, in the conventional A/D converter apparatus, in case that the characteristics required for the digital filter are changed, if the gradient of two times must be realized in the transition band with respect to the frequency characteristics of the high pass filter 6, the means for satisfying the required characteristics can not be selected by increasing the order of the filter, because the structure of the filter and the data rate are secure.

In the conventional A/D converter apparatus for the audio CODEC circuit, in case that the sharp characteristics is required in the transition band of the high pass filter for removing the DC component, the requirement can be satisfied by increasing the order of the filter, but the circuit scale is increased accompanying with the increment of the order.

SUMMARY OF THE INVENTION

An object of the present invention is to provide an A/D converter apparatus and a D/A converter apparatus which can realize sharp characteristics in a transition band, while preventing a circuit scale from being increased in a high pass filter design.

Since a digital filter operates at a data rate of an input signal (equivalent to the sampling rate, in the present invention), a frequency characteristic has a property depending on an operation rate. By decreasing the data rate of the input signal for the digital filter using this property, the sharp frequency change in the transition band is realized, without increasing the order of the digital filter.

When the sampling rate is Fs, the frequency band which can be represented is known to Fs/2 by the sampling theorem. When the sampling rate becomes Fs/2 which is 1/2 times, the frequency band which can be represented becomes 1/2 times, that is, Fs/4.

FIGS. 2A and 2B show the frequency characteristics of the high pass filter. The horizontal axis shows frequency and the vertical axis shows the signal amplitude. FIG. 2A shows the frequency characteristics in case that the sampling rate is Fs and FIG. 2B shows the frequency characteristics in case that the sampling rate is Fs/2. As shown in FIG. 2A, if the transition band of the high pass filter when the sampling rate is Fs is at the frequencies fa1, fc1, the sampling rate becomes 1/2 times and thus the two frequencies are moved into frequencies fa1/2, fc1/2, as shown in FIG. 2B. Thus, the gradient in the transition band becomes from "$\alpha = \Delta A/(fc1-fa1)$" (see FIG. 2A) to "$\beta = \Delta A/((fc1-fa1)/2) = 2\alpha$" (se FIG. 2B), that is, 2 times ($\Delta A$ is the increment of the amplitude value in the transition band).

If the change of the gradient due to the above-mentioned sampling rate is used, a desired gradient can be obtained by adjusting the sampling rate in the state that the high pass filter is designed so that the gradient thereof is smoother than the gradient of the needed transition band. Also, by introducing this method, the increment of the circuit scale can be prevented without increasing the order of the filter.

The A/D converter apparatus according to the present invention comprises an anti-aliasing filter for removing a frequency component corresponding to an aliasing noise generated by sampling; an A/D converter for converting an analog signal output from the anti-aliasing filter into a digital signal; a SINC filter for removing a frequency component corresponding to an aliasing noise generated by down-sampling from a signal output from the A/D converter; a first decimator for down-sampling a signal output from the SINC filter; a low pass filter for removing a frequency component corresponding to an aliasing noise generated by down-sampling from a signal output from the first decimator; a second decimator for down-sampling a signal output from the low pass filter; a high pass filter for removing a DC component from a signal output from the second decimator; and a third decimator for down-sampling a signal output from the high pass filter.

The D/A converter apparatus according to the present invention comprises a first interpolator for up-sampling a digital input signal; a high pass filter for removing a DC component from an output of the first interpolator; a second interpolator for up-sampling a signal output from the high pass filter; a first low pass filter for removing an out-of-band noise from a signal output from the second interpolator; a third interpolator for up-sampling a signal output from the first low pass filter; a second low pass filter for removing an out-of-band noise from a signal output from the third interpolator; a D/A converter for converting a digital signal output from the second low pass filter into an analog signal; and a smoothing filter for smoothing the analog signal output from the D/A converter.

According to the present invention, although the sharp change in the transition band is required with respect to the frequency characteristics of the high pass filter, only by decreasing the sampling rate of the input signal, the sharp change can be accomplished without increasing the order of the digital filter and the circuit scale can be prevented from be increased. Also, although there is no a change in the required frequency characteristics, the order of the digital filter can be decreased by decreasing the sampling rate and the circuit scale can be reduced.

DETAILED DESCRIPTION OF THE PREFERRED EMBODIMENTS

First Embodiment

Figure 1:
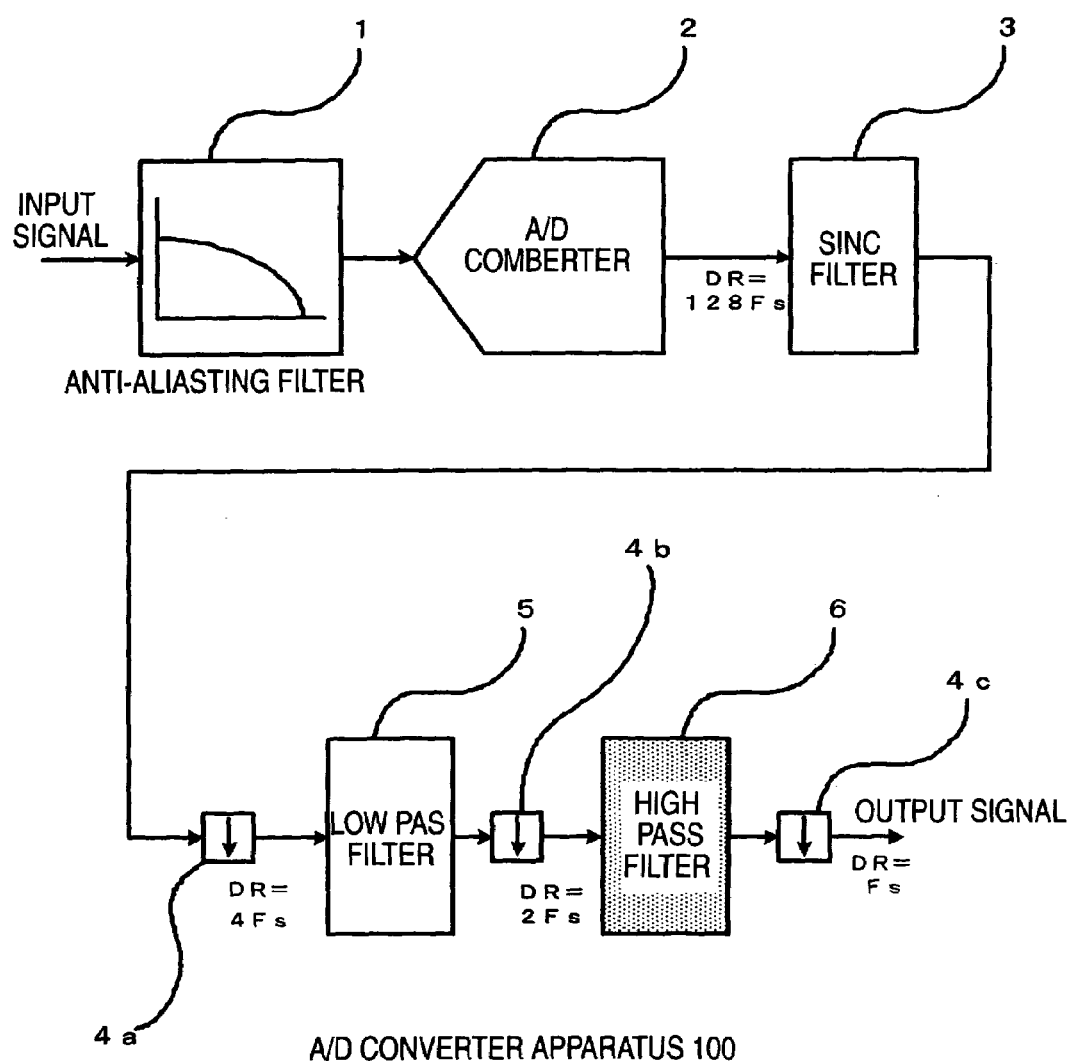
FIG. 1 is a block diagram showing a schematic structure of an A/D converter apparatus according to a first embodiment of the present invention.
Figure 2A:
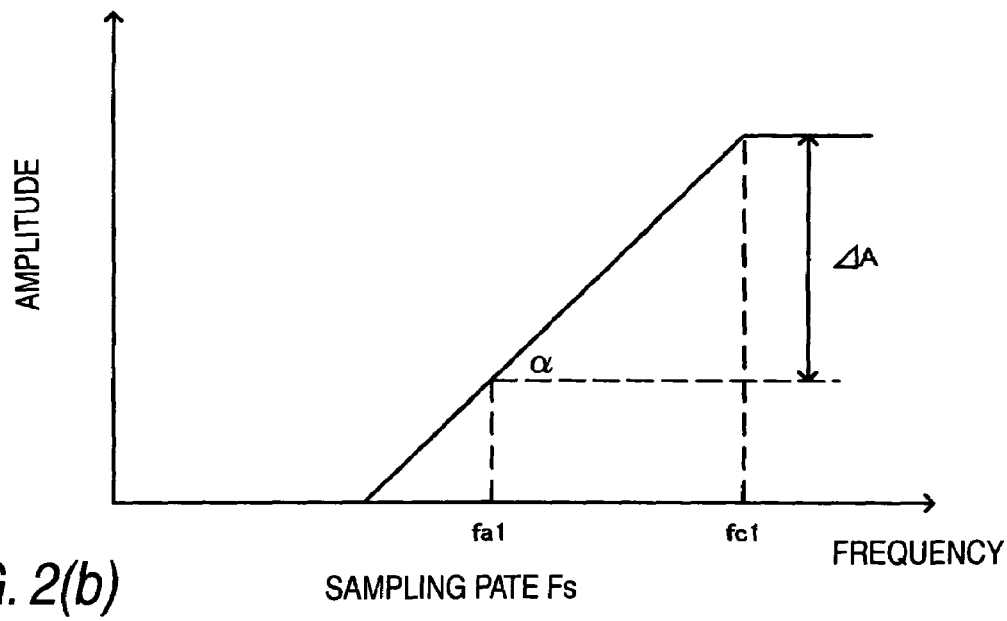
FIGS. 2A and 2B show the frequency characteristics of a high pass filter.
Figure 2B:
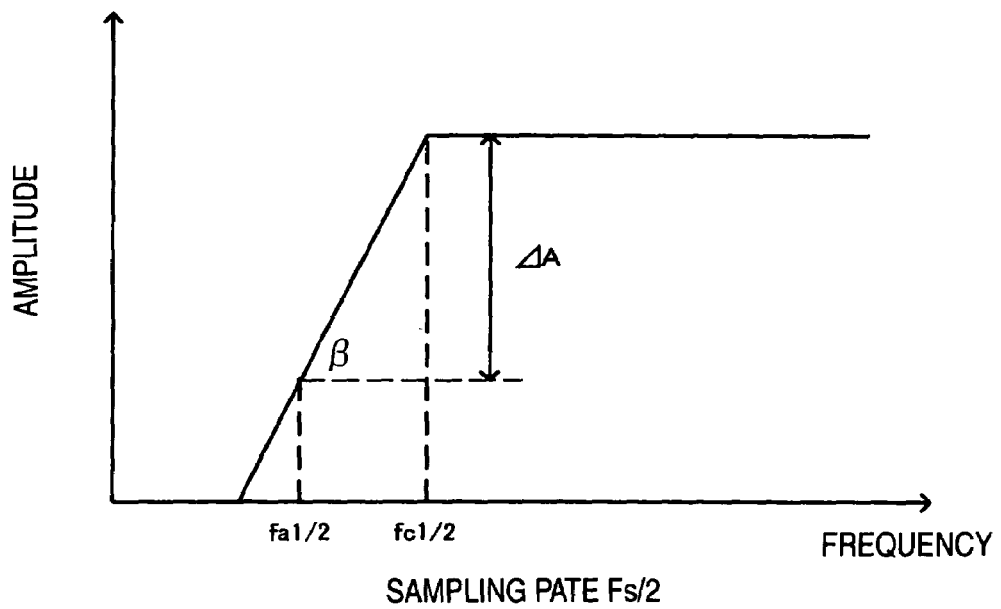

FIG. 1 is a block diagram showing a schematic structure of an A/D converter apparatus 100 according to a first embodiment of the present invention. The A/D converter apparatus 100 comprises an anti-aliasing filter 1 for previously removing an aliasing noise generated by sampling, an A/D converter 2 for converting an analog signal into a digital signal at a sampling rate of 128Fs (Fs is the data rate of the digital signal which is desired to be obtained), a SINC filter (comb filter) 3 for removing an aliasing noise due to down-sampling, a first decimator 4a for performing down-sampling at the data rate of DR=4Fs, a low pass filter 5 for removing an aliasing noise due to down-sampling, a second decimator 4b for performing down-sampling at the data rate of DR=2Fs, a high pass filter 6 for removing a DC component from a signal output from the decimator 4b, and a third decimator 4c for down-sampling a signal output from the high pass filter 6 at the data rate of DR=Fs.

The anti-aliasing filter 1 previously removes the aliasing noise in the needed signal band generated by the sampling of the A/D converter 2.

The SINC filter 3 is used for previously removing the noise at the vicinity of 4Fs in order to thin out the digital signal which is over-sampled to 128 times by the A/D converter 2 till the data rate becomes 4Fs. After the noise at the vicinity of 4Fs is reduced by the SINC filter 3, the down-sampling is performed by the decimator 4a.

The low pass filter 5 previously removes the noise at the vicinity of 2Fs in order to thin out the digital signal till the data rate becomes 2Fs by the decimator 4b. By inserting the low pass filter 5 into this location, the data rate can be decreased to 2Fs just before the high pass filter 6. At the result, the circuit scale of the high pass filter 6 can be decreased.

Figure 5:
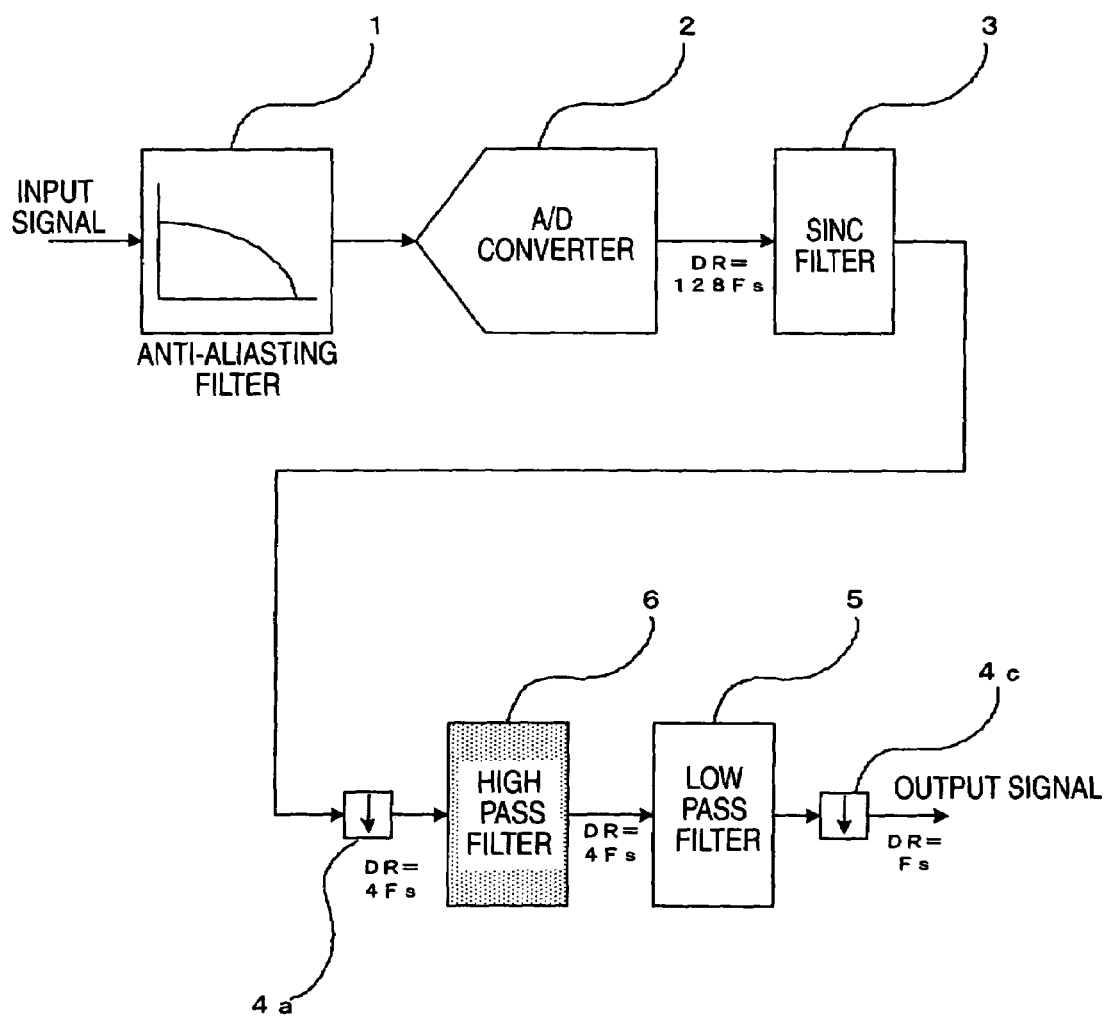
FIG. 5 is a block diagram showing a schematic structure a conventional A/D converter apparatus.

Here, the other structure which the sampling rate of the digital signal input to the high pass filter 6 is 2Fs will be considered. For example, as the structure in FIG. 5 shown as the conventional example, the data rate can be decreased to 2Fs by the decimator 4a. However, in this structure, the noise which is not completely removed by the SINC filter 3 is aliased to be invaded to the needed signal band. Accordingly, the remarkable deterioration of the S/N ratio is caused.

Also, as the structure in FIG. 5 shown as the conventional example, if the data rate is reduced to 2Fs by the decimator 4a and the noise at the vicinity of 2Fs is previously removed by the SINC filter 3, the noise is not invaded to the needed signal band. However, in case that the SINC filter 3 is designed so as to remove the noise at the vicinity of 2Fs, the cut-off frequency of the SINC filter 3 is remarkably reduced so that the needed signal band may be reduced. In order to compensate this, the frequency characteristics of the low pass filter 5 should be finely adjusted.

In this case, in order to finely adjust the frequency characteristics of a low pass filter 5, a plurality of the design parameters are required (the order is increased) and thus the circuit scale is increased. Accordingly, as the present embodiment shown in FIG. 1, it is preferable that the sampling rate is reduced to 2Fs by the decimator 4b after the noise of 2Fs is removed by the low pass filter 5.

In this case, since the input signal of the high pass filter 6 has the data rate of 2Fs, the high pass filter 6 preferably operates at 2Fs and the gradient of the frequency characteristics in the transition band is increased to 2 times, compared with the operation at 4Fs of the conventional example, although it uses the same filter.

In order to describe this in detail, the equation of the discrete Fourier transform is expressed by the equation (1).

$$X(k) = \sum_{n=0}^{N-1} x(n) W_N^{kn} \quad (0 \le k \le N-1) \quad \text{(Equation 1)}$$

Here, $$W_N = e^{-j\frac{2\pi}{N}} \quad \text{(Equation 2)}$$

The equation (1) shows N-point discrete Fourier transform and x(n) is a periodic discrete time signal of the period N. Here, considering that the signal x(n) is the sampling signal at the period Ts of the consecutive time signal x(t), if the parameter Ts is introduced to the equation (1), it is expressed by the equation (3).

$$x(j\omega_k) = \sum_{n=0}^{N-1} x(nT_s) W_N^{kn} \quad (0 \le k \le N-1) \quad \text{(Equation 3)}$$

In equation (3), $\omega_k$ is 2Πk/N/Ts and shows that the spectrum X (j$\omega_k$) is discretely represented by the interval of 2Π/N/Ts. Accordingly, in case of increasing the sampling period to two times, that is, Ts' (=2Ts), the spectrum (j$\omega_k$) is represented by the interval of 2Πk/Ts', that is, (2Π/N/Ts)/2. Although the sampling period is changed from Ts to Ts', the value of X(j$\omega_k$) is not changed with respect to the same k value. However, since the interval of $\omega_k$ becomes reduced to 1/2, the spectrum is compressed to 1/2 on the frequency axis, compared with the case that the sampling period is Ts. From this, it can be seen that the change of the sampling rate adjusts the gradient in the transition band of the filter.

As mentioned above, by using the circuit structure of the present embodiment, the circuit area of the high pass filter 6 can be reduced. Although the sampling rate is finely defined in the present embodiment, it is only an example and any combination can be used. It is important that, after positioning the low pass filter 5 before the high pass filter 6, the down-sampling is performed just before the high pass filter 6.

Second Embodiment

Figure 3:
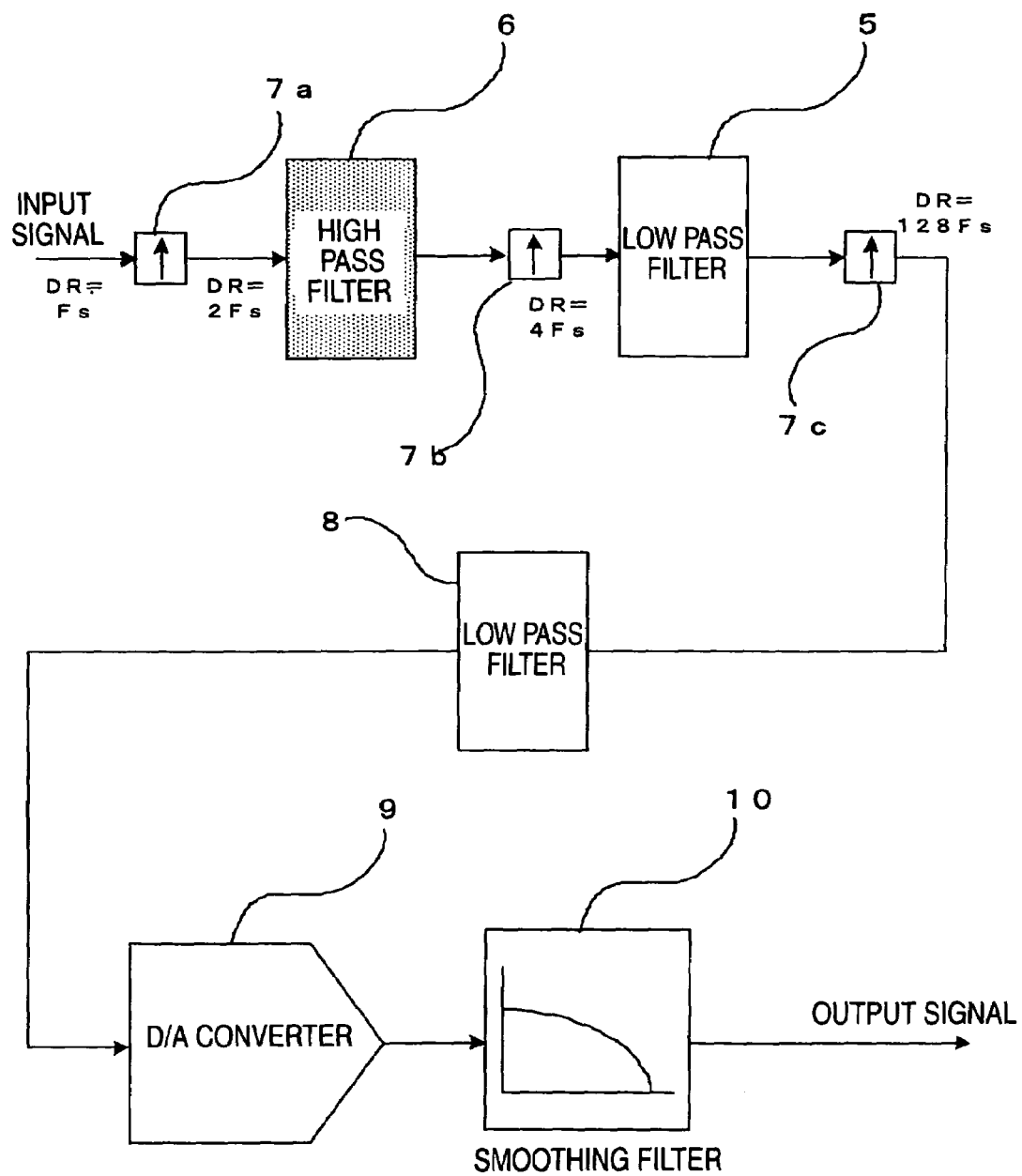
FIG. 3 is a block diagram showing a schematic structure of a D/A converter apparatus according to a second embodiment of the present invention.

FIG. 3 is a block diagram showing a schematic structure of a D/A converter apparatus 200 of a second embodiment of the present invention. The D/A converter apparatus 200 comprises a first interpolator 7a for increasing the data rate of a digital input signal to 2Fs, a high pass filter 6 for removing a DC component, similar to the first embodiment, a second interpolator 7b for increasing the data rate thereof to 4Fs, a first low pass filter 5 for removing the spectrum at 2Fs, 3Fs among the spectrums of the digital input signal which are repeated at the interval of Fs and allowing the spectrum to be repeated for each 4Fs, a third interpolator 7c for increasing the data rate to 128Fs, a second low pass filter 8 for removing the spectrum which exists at the interval of 4Fs, a D/A converter 9 for converting the digital signal into an analog signal, and a smoothing filter 10 for removing an aliasing spectrum shifted to the band of 128Fs by the third interpolator 7c and extracting only the spectrum of the needed band, in addition to the function for converting the digital signal expressed by a discrete value into an analog signal.

In the structure of the D/A converter apparatus 200 described in the embodiment of the present invention, by setting the data rate of the digital input signal of the high pass filter 6 to 2Fs, the frequency characteristics in the transition band of the high pass filter 6 can become sharp.

Third Embodiment

Figure 4:
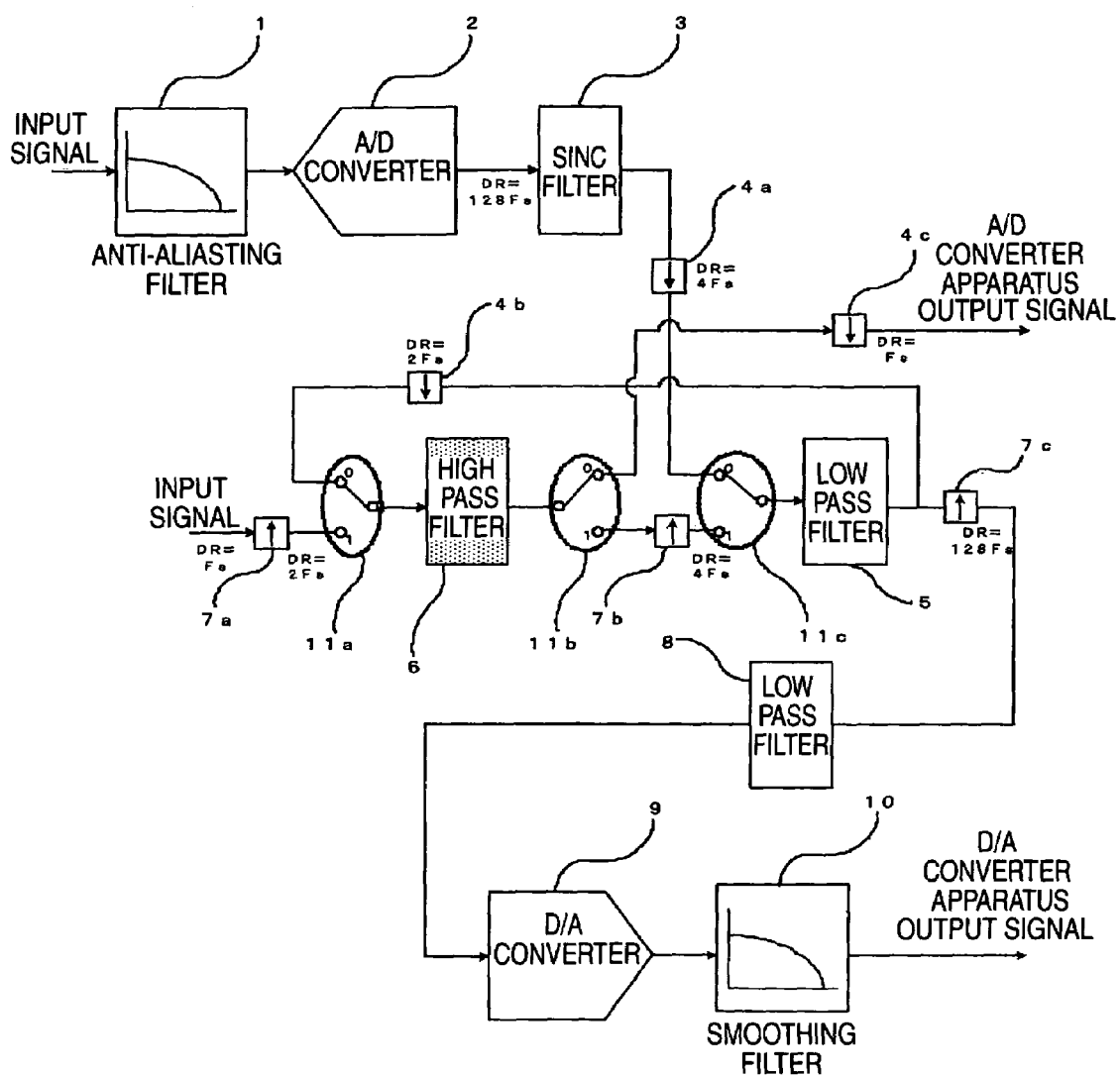
FIG. 4 is a block diagram showing a schematic structure of an A/D and D/A converter apparatus according to a third embodiment of the present invention.

FIG. 4 is a block diagram showing a schematic structure of an A/D and D/A converter apparatus 300 composed by combining the A/D converter apparatus 100 described in the first embodiment and the D/A converter apparatus 200 described in the second embodiment. The A/D and D/A converter apparatus 300 of the present embodiment comprises an anti-aliasing filter 1, an A/D converter 2, a SINC filter (comb filter) 3, first to third decimators 4a, 4b, and 4c, a first low pass filter 5, a high pass filter 6, first to third interpolators 7a, 7b, and 7c, a second low pass filter 8, a D/A converter 9, a smoothing filter 10, and first to third switches 11a, 11b, and 11c each having a terminal A and a terminal B which are switched in response to a control signal as a sharing means for switching data paths for A/D conversion and D/A conversion.

The functions of the components are equal to that described in the first and second embodiments. The A/D and D/A converter apparatus 300 functions as the A/D converter apparatus by selecting the terminals A when the control signals of the switches 11a, 11b, and 11c are 0 and functions the D/A converter apparatus by selecting the terminals B when the control signals are 1.

In other words, when the control signals of the first to third switches 11a, 11b, and 11c are 0, the signal output from the SINC filter 3 passes through the first low pass filter 5, is input to the second decimator 4b such that the data rate thereof is decreased to 2Fs and then is input to the high pass filter 6. Then, the signal is output at the data rate of Fs by the third decimator 4c and the same operation as that of the A/D converter apparatus 100 described in the first embodiment is performed.

On the other hand, when the control signals of the first to third switches 11a, 11b, and 11c are 1, the digital input signal is up-sampled to 2Fs by the first interpolator 7a and then passes through the high pass filter 6. Then, after the signal is input to the second interpolator 7b such that the data rate thereof is increased up to 4Fs, it is input to the low pass filter 5, and the same operation as that of the D/A converter apparatus 200 described in the second embodiment is performed.

In the present embodiment, the above-mentioned values of the date rate are only examples, and the other value may be used. But, in the A/D converting operation, it is important that the second decimator 4b is inserted between the first low pass filter 5 and the high pass filter 6. In the D/A converting operation, it is important that the signal is up-sampled by the second interpolator 7b after the high pass filter 6 and then is input to the first low pass filter 5. These structures are the important points of the present invention.

Although the A/D converter apparatus and the D/A converter apparatus used in the audio CODEC circuit is described in the above-mentioned description, the present invention can be applied to the A/D converter apparatus and the D/A converter apparatus used in the application such as video processing.

Although the sharp change in the transition band is required with respect to the frequency characteristics of the high pass filter, the A/D and D/A converter apparatus according to the present invention can realize the sharp change only by decreasing the sampling rate of the input signal without increasing the order of the digital filter and can prevent the circuit scale from be increased. Accordingly, it can be used as an A/D and D/A converter apparatus including a digital filter.

What is claimed is:

1. An A/D converter apparatus comprising:
   an anti-aliasing filter for removing a frequency component corresponding to an aliasing noise generated by sampling;
   an A/D converter for converting an analog signal output from the anti-aliasing filter into a digital signal;
   a SINC filter for removing a frequency component corresponding to an aliasing noise generated by down-sampling from a signal output from the A/D converter;
   a first decimator for down-sampling a signal output from the SINC filter;
   a low pass filter for removing a frequency component corresponding to an aliasing noise generated by down-sampling from a signal output from the first decimator;
   a second decimator for down-sampling a signal output from the low pass filter;
   a high pass filter for removing a DC component from a signal output from the second decimator; and
   a third decimator for down-sampling a signal output from the high pass filter.

2. A D/A converter apparatus comprising:
   a first interpolator for up-sampling a digital input signal;
   a high pass filter for removing a DC component from an output of the first interpolator;
   a second interpolator for up-sampling a signal output from the high pass filter;
   a first low pass filter for removing an out-of-band noise from a signal output from the second interpolator;
   a third interpolator for up-sampling a signal output from the first low pass filter;
   a second low pass filter for removing an out-of-band noise from a signal output from the third interpolator;
   a D/A converter for converting a digital signal output from the second low pass filter into an analog signal; and
   a smoothing filter for smoothing the analog signal output from the d/a converter.

3. An A/D and D/A converter apparatus having the A/D converter apparatus according to claim 1 and the D/A converter apparatus according to claim 2, comprising a sharing means for sharing the high pass filter and the low pass filter in the A/D converter apparatus and the high pass filter and the low pass filter in the D/A converter apparatus.

4. The A/D and D/A converter apparatus according to claim 3, wherein the sharing means comprises:
   a first switch for selecting the output of the second decimator or the output of the first interpolator to supply it to the high pass filter;
   a second switch for supplying the output of the high pass filter to the third decimator or the second interpolator; and
   a third switch for selecting the output of the first decimator or the output of the second interpolator to supply it to the low pass filter.

* * * * *